United States Patent
Chiu et al.

(10) Patent No.: US 12,426,208 B2
(45) Date of Patent: Sep. 23, 2025

(54) MODULAR LIQUID COOLING ARCHITECTURE FOR LIQUID COOLING

(71) Applicant: Google LLC, Mountain View, CA (US)

(72) Inventors: Jerry Chiu, Pacifica, CA (US); Madhusudan K. Iyengar, Foster City, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/636,967

(22) Filed: Apr. 16, 2024

(65) Prior Publication Data

US 2024/0284635 A1 Aug. 22, 2024

Related U.S. Application Data

(62) Division of application No. 17/532,031, filed on Nov. 22, 2021, now Pat. No. 11,991,857.

(51) Int. Cl.
H05K 7/20 (2006.01)

(52) U.S. Cl.
CPC ......... H05K 7/203 (2013.01); H05K 7/20127 (2013.01); H05K 7/20318 (2013.01); H05K 7/20818 (2013.01)

(58) Field of Classification Search
CPC ............ H05K 7/20745; H05K 7/2079; H05K 7/20827; H05K 7/203; H05K 7/20127; H05K 7/14329; H05K 7/20318; H05K 7/20818; H05K 7/20236; H05K 7/1462; H05K 7/1467; H05K 7/1475
See application file for complete search history.

(56) References Cited

U.S. PATENT DOCUMENTS

| 6,714,412 B1 * | 3/2004 | Chu ............... H05K 7/2079 165/157 |
| 7,752,858 B2 | 7/2010 | Johnson et al. |
| 8,014,150 B2 | 9/2011 | Campbell et al. |

(Continued)

FOREIGN PATENT DOCUMENTS

| JP | 2016509278 A | 3/2016 |
| JP | 2018060884 A | 4/2018 |

(Continued)

OTHER PUBLICATIONS

International Preliminary Report on Patentability or International Application No. PCT/US2022/050249 dated Jun. 6, 2024. 10 pages.

(Continued)

*Primary Examiner* — Jayprakash N Gandhi
*Assistant Examiner* — Matthew Sinclair Muir
(74) *Attorney, Agent, or Firm* — Lerner David LLP (57) ABSTRACT

A housing and cooling system for computer hardware includes an infrastructure module and a payload module. The infrastructure module is configured for housing computer hardware and is equipped with either or both of a convective air cooling system and an arrangement of metal plates connected by one or more conduits for carrying liquid for cooling computer equipment housed by the infrastructure module. The infrastructure modules also houses a programmable logic controller ("PLC"). The payload module includes an immersion cooling system governed by the PLC and is located outside of the infrastructure module.

13 Claims, 6 Drawing Sheets

(56) References Cited

U.S. PATENT DOCUMENTS

| | | | |
|---|---|---|---|
| 8,274,790 B2 | 9/2012 | Campbell et al. | |
| 8,672,732 B2* | 3/2014 | Rasmussen | H05K 7/2079 |
| | | | 454/184 |
| 8,959,941 B2* | 2/2015 | Campbell | H05K 7/20781 |
| | | | 361/679.52 |
| 9,363,924 B2 | 6/2016 | Campbell et al. | |
| 9,445,530 B2 | 9/2016 | Reytblat et al. | |
| 9,891,682 B1* | 2/2018 | Czamara | G06F 1/266 |
| 10,143,113 B2 | 11/2018 | Shelnutt et al. | |
| 10,206,307 B2 | 2/2019 | Lau | |
| 10,405,457 B2* | 9/2019 | Boyd | H05K 7/20272 |
| 10,674,635 B2 | 6/2020 | Gao et al. | |
| 10,842,053 B2* | 11/2020 | Cader | G06F 1/20 |
| 11,317,543 B1 | 4/2022 | Gao | |
| 11,576,283 B2* | 2/2023 | Chen | H05K 7/20627 |
| 2011/0132579 A1 | 6/2011 | Best et al. | |
| 2013/0021752 A1 | 1/2013 | Campbell et al. | |
| 2015/0146367 A1 | 5/2015 | Chen | |
| 2015/0192345 A1 | 7/2015 | McDonnell et al. | |
| 2016/0073548 A1 | 3/2016 | Wei et al. | |
| 2017/0295676 A1 | 10/2017 | Conn et al. | |
| 2018/0098464 A1 | 4/2018 | Ishinabe | |
| 2018/0323859 A1 | 11/2018 | Patel et al. | |
| 2019/0200482 A1 | 6/2019 | Boyd et al. | |
| 2019/0356159 A1* | 11/2019 | Coccia | H05K 7/1492 |
| 2019/0384376 A1 | 12/2019 | Mathews et al. | |
| 2020/0093025 A1 | 3/2020 | Enright et al. | |
| 2020/0097429 A1* | 3/2020 | Kiener | H04Q 1/13 |
| 2020/0351171 A1* | 11/2020 | Ozonat | H04L 41/16 |
| 2021/0153392 A1 | 5/2021 | Gao | |
| 2021/0368655 A1 | 11/2021 | Gao | |
| 2022/0011835 A1* | 1/2022 | Heydari | G05B 19/02 |
| 2022/0151097 A1* | 5/2022 | McManis | H05K 7/20272 |
| 2022/0225545 A1* | 7/2022 | Heydari | H05K 7/20736 |
| 2022/0341860 A1* | 10/2022 | Fitch | H05K 7/203 |

FOREIGN PATENT DOCUMENTS

| | | |
|---|---|---|
| WO | 2020061305 A1 | 3/2020 |
| WO | 2020254917 A1 | 12/2020 |

OTHER PUBLICATIONS

Office Action for Japanese Patent Application No. 2023-571625 dated Oct. 29, 2024. 4 pages.

International Search Report and Written Opinion for International Application No. PCT/US2022/050249 dated Apr. 3, 2023. 15 pages.

Notice of Grant for Japanese Patent Application No. 2023-571625 dated Jan. 21, 2025. 3 pages.

* cited by examiner

MODULAR LIQUID COOLING ARCHITECTURE FOR LIQUID COOLING

CROSS-REFERENCE TO RELATED APPLICATIONS

The present application is a divisional of U.S. patent application Ser. No. 17/532,031, filed on Nov. 22, 2021, the disclosure of which is incorporated herein by reference.

BACKGROUND

Computer hardware generates heat during operation and tends to operate better and fail at lower rates when cooled. For this reason, cooling systems for computer hardware have been developed. A variety of cooling systems can be found in individual datacenters, which frequently house several types of computer hardware with differing cooling needs. Individual server racks or other cabinet-style housing for hardware may have convective air cooling systems, such as liquid-air heat exchangers, or cold plate systems wherein conductive elements with liquid conduits running therethrough are placed in contact with components to be cooled. Elsewhere in the center, immersion cooling systems may include a tank in which computer hardware may be immersed in evaporable liquid and a condenser positioned above the tank. These solutions can be inconvenient for customers that use the datacenter for hardware with disparate cooling needs because of the additional labor involved in accessing hardware distributed across different locations in the center. Further problems can arise if direct communication is desired between pieces of hardware with different cooling needs. For example, components that generate relatively little heat may be placed in the tank along with components that must be immersion cooled if direct communication between those components is unnecessary, resulting in unnecessary expense and crowding of the tank. Some components cannot be immersion cooled in any case, so placing such components in communication with immersion cooled components can involve significant difficulty.

BRIEF SUMMARY

Aspects of this disclosure are directed to a modular liquid cooling system that can implement immersion and condenser cooling modules in cooperation with lower cooling capacity modules such as liquid-air exchangers or cold plate arrangements. Racks can be disaggregated to one or more infrastructure modules and one or more payload modules for better flexibility and utilization. The infrastructure module, containing lower power air cooled information technology ("IT") or other computing equipment, may rely on a low impedance rear door heat exchanger or cold plates with heat transferred locally to facility water. The payload module, containing higher powered IT or other computing equipment, may rely on two phase immersion cooling to transfer heat immediately to facility water.

The infrastructure module may house a programmable logic controller ("PLC") governing the cooling functions of each module. As such, the PLC may govern the infrastructure module's heat exchanger as well as aspects of the immersion cooling system of each payload module. Power for some or all functions of the payload modules and the computing equipment housed by the payload modules may also be routed though the infrastructure module. Cooling fluid may be supplied to all modules in series or in parallel or first to the infrastructure module, then to each payload module in parallel.

In another aspect, a housing and cooling system for computer hardware may comprise an infrastructure module configured for housing computer hardware. The infrastructure module may be equipped with either or both of a convective air cooling system and an arrangement of metal plates connected by one or more conduits for carrying liquid for cooling computer equipment housed by the infrastructure module. The infrastructure module may house a PLC. The system may also comprise a payload module including an immersion cooling system governed by the PLC and located outside of the infrastructure module.

In another arrangement according to any of the foregoing, the infrastructure module may include one or more racks of computing hardware having a first power consumption level.

In another arrangement according to any of the foregoing, the payload module may include computing hardware having a second power consumption level, the second power consumption level being greater than the first power consumption level.

In another arrangement according to any of the foregoing, the payload module may have the dimensions of a single EIA-310 standard server rack or of two or three adjoining EIA-310 standard server racks.

In another arrangement according to any of the foregoing, the convective air cooling system includes a liquid-air heat exchanger.

In another arrangement according to any of the foregoing, the heat exchanger or conduits of the infrastructure module may be fluidly connected to a condenser of the payload module.

In another arrangement according to any of the foregoing, a flow path of cooling fluid through the housing and cooling system may pass through the cooling arrangement of the infrastructure module before reaching the condenser.

In another arrangement according to any of the foregoing, the payload module may be a first payload module, and comprising a second payload module including an immersion cooling system, the immersion cooling systems of the first and second payload modules being governed by the PLC through a central fluid management system housed within the infrastructure module.

In another arrangement according to any of the foregoing, the infrastructure module may include an infrastructure bus bar and the payload module includes a payload bus bar that is electrically connected to the infrastructure bus bar.

In another arrangement according to any of the foregoing, the infrastructure module and the payload module may each include a respective bus bar, the bus bar of the payload module is connected to the bus bar of the infrastructure module, and the bus bar of the infrastructure module is provided with a connector for receiving power from an external power supply.

In another example according to any of the foregoing, the payload module may be a first payload module. The immersion cooling system of the first payload module may include a first condenser. The housing and cooling system may also comprise a second payload module, the second payload module may include an immersion cooling system governed by the PLC and including a second condenser. The first condenser and the second condenser may be connected in series along a flow path of cooling fluid.

In another example according to any of the foregoing, the housing and cooling system may also comprise a distribution system circulating cooling liquid through the infrastructure and payload modules. The housing and cooling system may also comprise a dry cooler through which the distribution system passes, the dry cooler being configured to exchange heat from the cooling liquid with ambient air.

In another arrangement according to any of the foregoing, the infrastructure and payload modules may be connected in series to the distribution system.

In another aspect, a method of housing and cooling computer hardware may comprise housing first computer hardware in an infrastructure module that also houses a ("PLC"). The method may also comprise immersing second computer hardware in evaporable liquid within a two phase immersion cooling system housed by a payload module. The payload module may be located outside of the infrastructure module and the immersion cooling system being governed by the PLC.

In another arrangement according to any of the foregoing, the method may comprise cooling the first computer hardware with a cooling arrangement included by the infrastructure module, the cooling arrangement of the infrastructure module being either or both of a liquid-air heat exchanger and an arrangement of metal plates connected by one or more conduits for carrying liquid.

In another aspect according to any of the foregoing, the method may comprise connecting the cooling arrangement of the infrastructure module and a condenser of the two phase immersion cooling system in parallel to a building liquid supply.

In another aspect according to any of the foregoing, the method may comprise connecting the cooling arrangement of the infrastructure module and the condenser in series to a building liquid supply.

In another aspect according to any of the foregoing, the method may comprise connecting the cooling arrangement of the infrastructure module and the condenser to the building liquid supply such that liquid is supplied by the building liquid supply to the cooling arrangement of the infrastructure module and is returned to the building liquid supply from the condenser.

In another aspect according to any of the foregoing, the method may comprise supplying electrical power to the payload module and the second computer hardware through the infrastructure module.

In another aspect according to any of the foregoing, the payload module may be a first payload module, and comprising immersing third computer hardware in evaporable liquid in a tank housed by a second payload module that includes a two phase immersion cooling system. The two phase immersion cooling system of the second payload module may be governed by the PLC.

DETAILED DESCRIPTION

Figure 1:
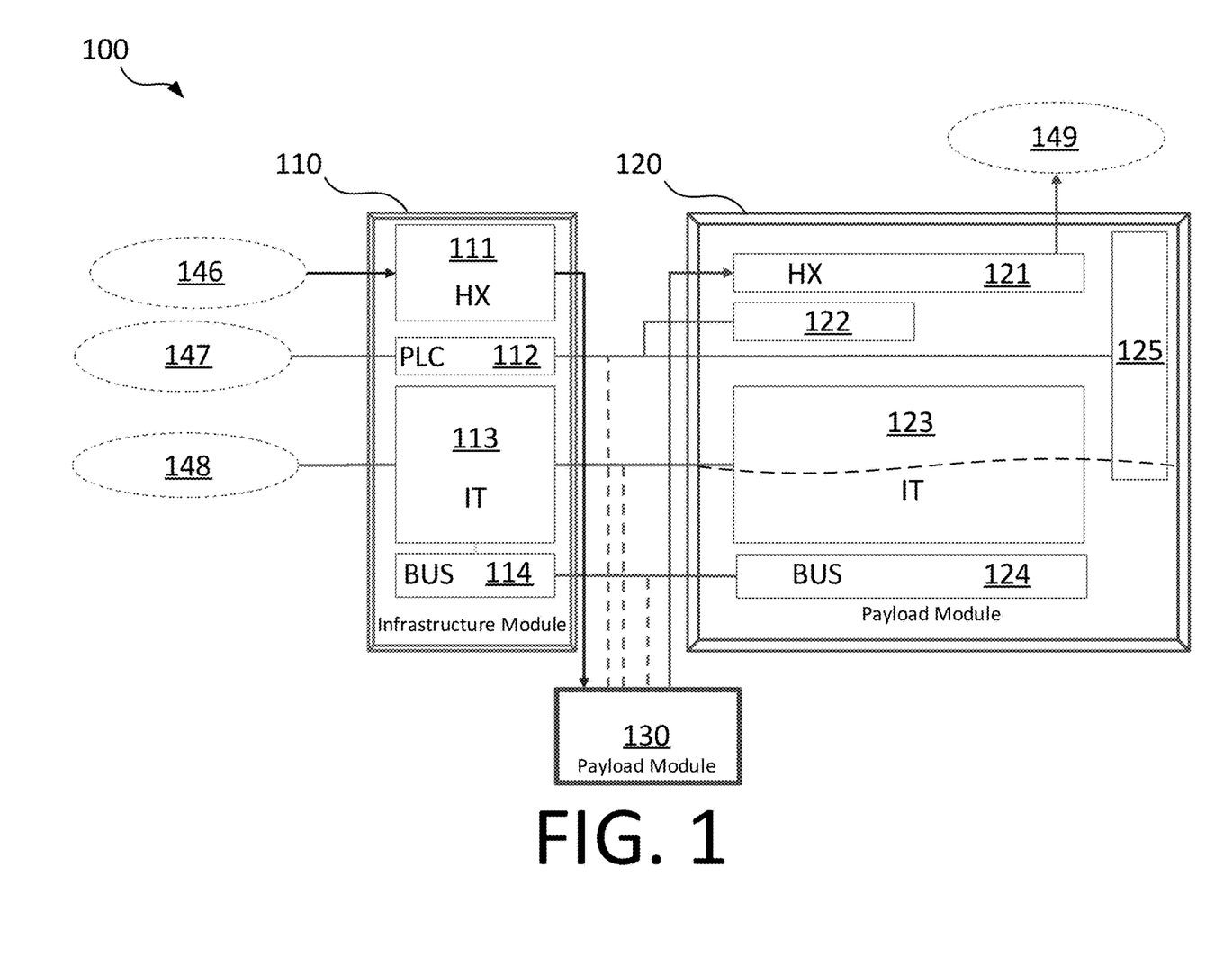
FIG. 1 is a schematic illustration of a modular cooling system according to a first arrangement.

FIG. 1 illustrates a modular cooling system 100 which may be used for information technology ("IT") equipment, other computer hardware, or other items that need to be cooled. System 100 includes infrastructure module 110 and first payload module 120. System 100 of the illustrate arrangement also includes a second payload module 130, though in system 100 may have as few as one payload module or any plural number of payload modules in other arrangements.

Infrastructure module 110 includes a housing for information technology ("IT") equipment or other electronic hardware. Infrastructure module 110 houses infrastructure hardware 113, which may be, for example, one or more racks of computer components, servers, other kinds of IT equipment, or other electronics, and which is housed by the housing of infrastructure module 110. Infrastructure includes and optionally houses a programmable logic controller ("PLC") 112 and an infrastructure bus bar 114 for conveying electric power to components of, within, or connected to infrastructure module 110. PLC 112 itself may optionally be included by infrastructure hardware 113.

Infrastructure module 110 may optionally also include a heat exchanger 111 as shown in the illustrated example. Heat exchanger 111 may be, for example, a liquid-air heat exchanger that uses a supply of cooling fluid to cool air for convective cooling of either or both of infrastructure hardware 113 and PLC 112. Air heated by either or both of infrastructure hardware 113 and PLC 112 may be impelled into heat exchanger 111 and for cooling before being exhausted out of infrastructure module 110 or recirculated within infrastructure module. In other examples, air received into heat exchanger 111 from outside or within infrastructure module 110 may be cooled by heat exchanger 111 first before being impelled across either or both of infrastructure hardware 113 and PLC 112. Such a liquid-air heat exchanger may be mounted to any wall or exterior surface of the housing of infrastructure module 110, such as, for example, a rear door or a front door.

In other examples, heat exchanger 111 may be a contact-based cold plate system that includes one or more plates of conductive material, such as aluminum, copper, other metals, or certain ceramics or polymers, or any combination thereof. The plates each have at least one conduit extending therealong or therethrough for directing cooling fluid to carry away heat from the cold plates. Either or both of infrastructure hardware 113 and PLC 112 can therefore be cooled by placement in contact with any of the cold plates.

Liquid-air heat exchangers and cold plate systems are presented as examples of heat exchanger 111, but heat exchanger 111 could be another type of heat exchanger having similar capabilities and operating needs.

System 100 also includes a first payload module 120. First payload module 120 includes a housing for electronic hardware, a payload bus bar 124, and a high-capacity cooling system. Payload bus bar 124 is configured for conveying electric power to components of, within, or connected to first payload module 120. The high-capacity cooling system may be, for example, a two phase immersion cooling system for electronic or other hardware. Such an immersion cooling system includes a tank for evaporable liquid and a condenser system 121 positioned above the tank or otherwise in a location that vapors from the tank would travel to the condenser system 121 and then return to the tank after condensing to liquid. Examples of suitable evaporable liquids include any of several commercially available dielectric fluids engineered specifically for immersion cooling of computer hardware, though water may be used in some applications, particularly where electrical conductivity of the evaporable fluid is not a concern. Condenser system 121 may be any known type of condenser, but in some examples, condenser system 121 includes one or more tubes carrying a cooling fluid that reduces the tubes to a temperature suitable for condensing vapors rising from the evaporable liquid in the tank. The immersion cooling system also includes a humidity control system 122 for monitoring and adjusting humidity within infrastructure module 120, via condenser system 121 or otherwise, and a fluid management system 125 for controlling the level of evaporable liquid within the tank. Fluid management system 125 may comprise, for example, any one or any combination of a pump, a filter, and a fluid level monitor for the evaporable fluid in the tank of first payload module's 120 immersion cooling system.

Payload hardware 123 may be one or more racks of electronic equipment immersed in the tank of evaporable liquid in first payload module's 120 immersion cooling system. Because payload module 120 has a high-capacity cooling system, payload hardware 123 housed and cooled by payload module 120 may be hardware with greater cooling needs, and having a greater power consumption level in some cases, than infrastructure hardware 113. In some examples, payload hardware 123 may also be greater in volume than infrastructure hardware 113. For example, where infrastructure hardware 113 occupies 12 rack units ("RU,") payload hardware 123 may occupy 24 RU, though any other volumes and ratios between volumes of infrastructure hardware 113 and payload hardware 123 are possible.

Infrastructure module 110 is operatively connected to first payload module 120 in several respects in the illustrated example. A coolant supply 146 is routed through infrastructure module 110 before reaching condenser system 121 and, after passing through condenser system 121, exiting system 100 through a coolant return 149 that leads recycles the coolant for coolant supply 146 or otherwise disposes of the coolant. The cooling fluid of coolant supply 146 can be liquid, such as, for example, water, glycol and water solutions, etc., or dielectric fluids such as fluorocarbons, or other liquids, or gas such as, for example, air, carbon dioxide, or other gases. In examples where infrastructure module 110 includes heat exchanger 111, coolant supply 146 may pass through and act as a coolant for heat exchanger 111 before reaching and acting as a coolant for condenser system 121. Coolant supply 146 and coolant return 149 are both part of a fluid coolant distribution system that circulates coolant through the respective internal cooling systems of modules 110, 120, 130 and system 100 as a whole. The distribution system, may be provided by a tap system, another type of building liquid supply system, or any other source of liquid or gas suitable for use as a coolant. Coolant supply 146 is at a relatively low temperature, and, because modules 110, 120, 130 transfer heat to the coolant as the coolant flows through a flow path of the distribution system, coolant return 149 is at a relatively high temperature. Downstream of coolant return 149 and upstream of coolant supply 146, the distribution system either cools the coolant or disposes the heated coolant and acquires new coolant at a lower temperature.

PLC 112 is in electronic communication with condenser system 121, humidity control system 122, and fluid management system 125. By this electronic connection between PLC 112, humidity control system 122, and fluid management system 125, PLC 112 controls humidity control system 122 and fluid management system 125 and thereby governs first payload module's 120 immersion cooling system. In various examples, PLC 112 may be able to power the immersion cooling system on or off, adjust a temperature maintained by the immersion cooling system, adjust flow rates within the immersion cooling system, or any combination of the foregoing. The governance of first payload module's 120 immersion cooling system by PLC 112 of infrastructure module 110 can simplify maintenance and operation of the immersion cooling system. Access to an immersion cooling system can be difficult and disruptive to the operation and cooling of hardware in the immersion cooling system because such systems are usually closed to prevent the escape of vapors. Accessing PLC 112 at infrastructure module 110, the housing of which may be a simple server cabinet or something similar, may therefore be relatively easy.

PLC 112 may also be in electronic communication with a management system 147, such as a building management system or data network. The connection between PLC 112 and management system 147 enables PLC 112 and the immersion cooling system of first payload module 120 to be controlled by a remote operator or in concert with other systems. In the illustrated example, infrastructure hardware 113 and payload hardware 123 are also in electronic communication with each other, though in other examples, infrastructure hardware 113 and payload hardware 123 may have no communication with each other.

A power and network connection 148 may also be routed through infrastructure module 110 before reaching first payload module 120. The power aspect of power and network connection 148 may be, for example, a building power supply, grid power supply, or battery. The network aspect of power and network connection 148 may be, for example, an internet, telephone, local area network or other electronic communication network. In the illustrated example, power is communicated between infrastructure hardware 113 and infrastructure bus bar 114, and infrastructure bus bar 114 is connected to payload bus bar 124. Thus, payload module 120 may receive some or all operating power for itself and for payload hardware 123 from connections to infrastructure module 110. However, payload module 120 and payload hardware 123 may acquire power from other sources as well, and in other examples, either or both of payload module 120 and payload hardware 123 may acquire all needed power from sources other than infrastructure module 110 and infrastructure hardware 113.

Systems may exist including infrastructure module 110 and only one payload module having the features of first payload module 120. However, system 100 of the illustrated example also includes a second payload module 130, which is the same as first payload module 120 with respect to all details of first payload module 120 described above. All connections between infrastructure module 110 and first payload module 120 also extend in parallel between infrastructure module 110 and second payload module 130 except for the flow path of coolant from coolant supply 146 and coolant return 149. The flow path from coolant supply 146 to coolant return 149 instead passes in series through infrastructure module 110 first, then through a condenser system within second payload module 130, and finally through condenser system 121 of first payload module 120. First payload module 120 therefore only receives coolant that has already been used for cooling by second payload module 130. Hardware to be cooled in each module 110, 120, 130 may therefore be chosen in view of the coolant's flow path to optimize efficiency in coolant and energy usage.

For example, expenses per unit volume of coolant, per unit of heat imparted to the coolant used, and per unit of electrical power necessary to operate system 100 and the hardware cooled by system 100 may be considered in finding a most economical distribution of hardware among modules 110, 120, 130.

Infrastructure module 110 may optionally be of a relatively small form factor, such as that of a typical server rack or cabinet. For example, infrastructure module 110 may have the shape and dimensions of an EIA-310 standard server rack, or at least dimensions similar enough to facilitate installation of infrastructure module 110 among such racks.

Payload modules 120, 130 may optionally be adapted for installation among typical server racks or cabinets. For example, payload modules 120, 130 have the same, or about the same, shape and dimensions as one, two, three, or more adjacent EIA-310 standard server racks such that the payload modules 120, 130 can be installed among such racks. Payload modules 120, 130 so configured may be installed adjacent to or near infrastructure module 110 in an area of a data center that has been set up for storing server racks. System 100 therefore enables types of hardware that might otherwise be scattered across a data center or among multiple different facilities due to their different cooling needs to be stored and operated in a single location. Further, system 100 enables cool-operating hardware that can be effectively cooled by heat exchanger 111 to be installed near to hardware that must be immersion cooled without not need immersion cooling to be installed near hardware that must be immersion cooled without the cool-operating hardware taking up space and wasting resources in an immersion cooling system. Installation of payload modules 120, 130 near infrastructure module 110 also facilitates access to and operation of the modules 110, 120, 130 by their owners or technicians. Installation of payload modules 120, 130 near infrastructure module 110 also simplifies electronic connection between infrastructure hardware 113, payload hardware 123, and hardware housed by second payload module 130.

The presence of only a first payload module 120 and a second payload module 130 in system 100 is shown by way of example, and systems with other numbers of payload modules may be created. In some examples, second payload module 130 may be omitted altogether such that a coolant flow path extends from infrastructure module 110 directly and only to first payload module 120 before exiting system 100 through coolant return 149. In other examples, system 100 may include any plural number of payload modules connected in series along the coolant flow path between infrastructure module 110 and first payload module 120. All such additional modules may be connected to infrastructure module 110 for transmission of electronic communication and power in the same manner as first payload module 120 and second payload module 130.

Figure 2:
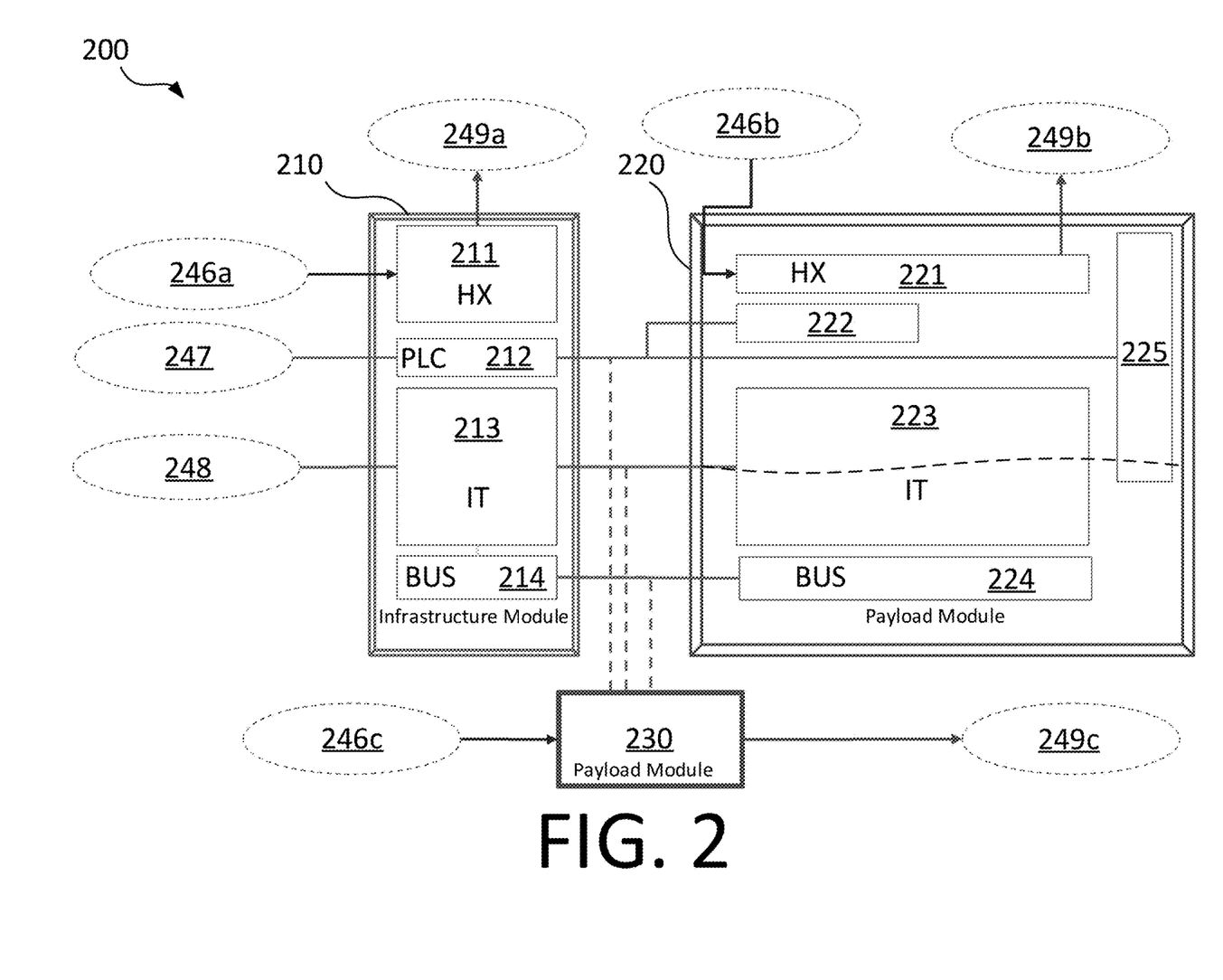
FIG. 2 is a schematic illustration of a modular cooling system according to a second arrangement.

FIG. 2 illustrates a system 200 in which elements are generally alike to like numbered elements of system 100. For example, infrastructure module 210 is the same as infrastructure module 110, first payload module 220 is the same as first payload module 120, second payload module 230 is the same as second payload module 130, and so on, except for specifically illustrated or described differences. For this reason, certain numerals in FIG. 2 may not be specifically mentioned herein. Moreover, all above described possible variations upon elements of system 100 are equally possible for elements of system 200 except to the extent they conflict with features of system 200 that differ from the features of system 100.

System 200 differs from system 100 in that coolant is supplied to each module 210, 220, 230 in parallel. Thus, coolant from a first coolant supply 246a flows through heat exchanger 211 before exiting system 200 through a first coolant return 249a, coolant from a second coolant supply 246b flows through first payload module's 220 condenser system 221 before exiting system 200 through a second coolant return 249b, and coolant from a third coolant supply 246c flows through a condenser system of second payload module 230 before exiting system 200 through a third coolant return 249c. In other examples wherein infrastructure module 210 lacks a heat exchanger 211, infrastructure module 210 may be without any coolant supply or coolant return.

The presence of only first payload module 220 and second payload module 230 in the illustrated example is one configuration of system 200, but in other examples, system 200 may omit second payload module 230, and in yet other examples, system 200 may include any number of payload modules with independent, parallel coolant supply and return connections.

Similar to system 100, system 200 enables infrastructure module 210 to be installed among one or more payload modules 220, 230 to provide easy access to governance of immersion cooling at PLC 212 and to store and operate hardware of different cooling needs in a single location. However, because modules 210, 220, 230 receive cooling fluid in parallel, heat generated by and removed from hardware in any one module 210. 220, 230 will have little or no effect on the cooling of hardware in any other module 210, 220, 230. The overall efficiency of system 200 will therefore be less dependent on the choice of which payload module 220, 230 will house and cool particular hardware than the efficiency of system 100.

Figure 3:
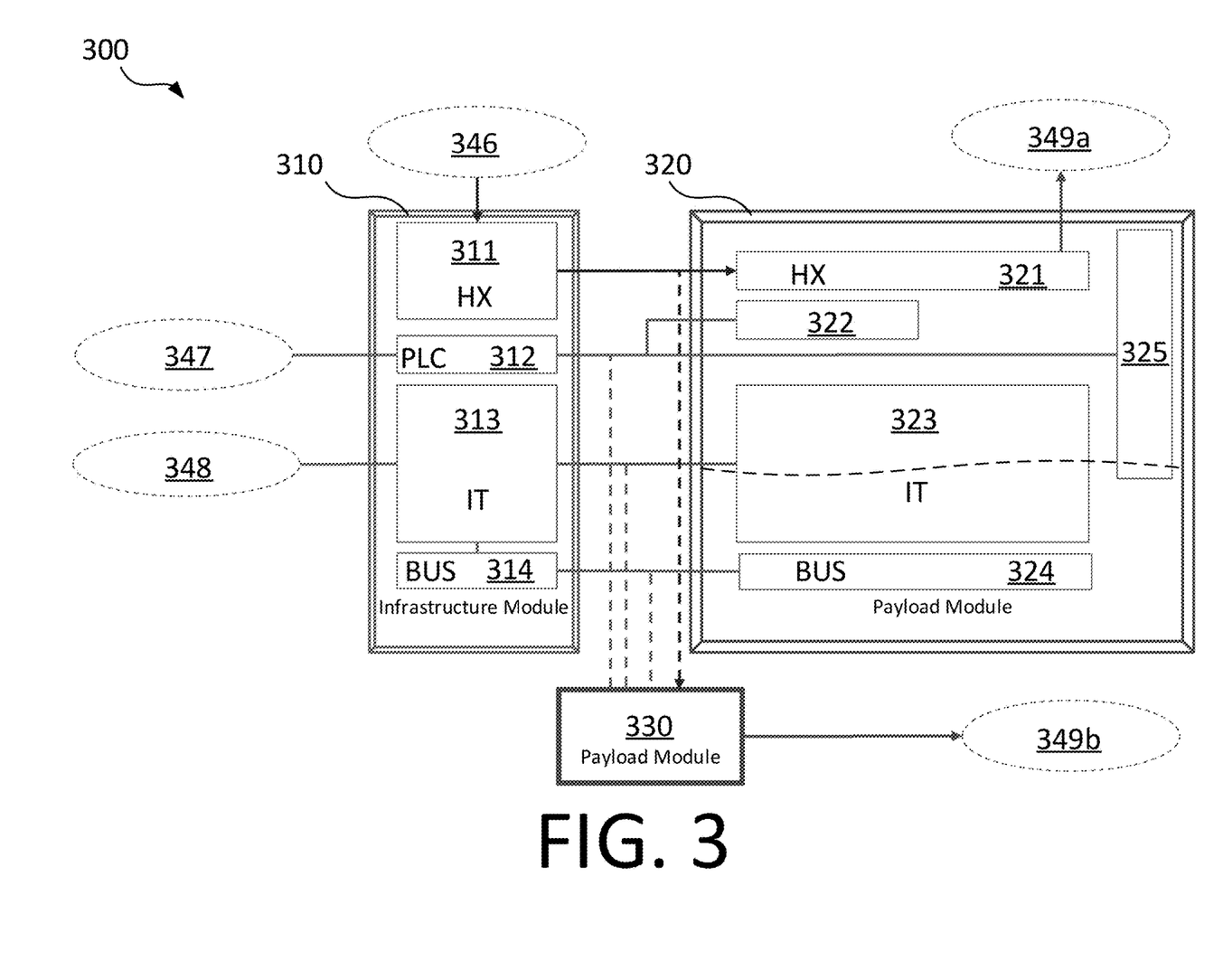
FIG. 3 is a schematic illustration of a modular cooling system according to a third arrangement.

FIG. 3 illustrates a system 300 in which elements are generally alike to like numbered elements of systems 100 and 200. For example, infrastructure module 310 is the same as infrastructure modules 110 and 210, first payload module 320 is the same as first payload modules 120 and 220, second payload 330 is the same as second payload modules 130 and 230, and so on, except for specifically illustrated or described differences. For this reason, certain numerals in FIG. 3 may not be specifically mentioned herein. Moreover, all above described possible variations upon elements of systems 100 and 200 are equally possible for elements of system 300 except to the extent they conflict with features of system 300 that differ from the features of systems 100 or 200.

In system 300, coolant is supplied to each payload module 320, 330 in parallel through infrastructure module 310. Thus, coolant from a coolant supply 346 flows through heat exchanger 311 before splitting into separate flow paths. One of the flow paths after the split extends through condenser system 321 of first payload module 320 before exiting system 300 through a first coolant return 349a while another flow path after the split extends through a condenser system of second payload module 330 before exiting system 300 through a second coolant return 349b.

The presence of only first payload module 320 and second payload module 330 in the illustrated example is one configuration of system 300, but in other examples, system 300 may omit second payload module 330, and in yet other examples, system 300 may include any number of payload modules that receive coolant in parallel with one another after the coolant has passed through heat exchanger 311 and before the coolant exits system 300 through a respective coolant return.

System 300 has all the capabilities that system 200 shares with system 100. Like system 200, system 300 is configured in a way that causes heating and cooling within any one payload module to have little, if any, effect on the temperature of coolant entering any other payload module. Routing all coolant through infrastructure module 310 first can simplify installation of system 300 in some cases, while connecting all modules in parallel as shown in system 200 may be simpler in other circumstances. Since infrastructure hardware 313 in some examples presents a relatively low heat load, cooling of payload modules 320, 330 may not be significantly impacted by their placement downstream of infrastructure module 310. However, if heat exchanger 311 splits coolant into separate channels expected to have differing heat loads within heat exchanger 311 and those separate channels flow to different payload modules 320, 330, the differing heat loads within heat exchanger 311 may be taken into account when choosing a payload module 320, 330 for specific hardware to optimize the cooling efficiency of system 300. Otherwise, similar to system 200, choice of payload modules 320, 330 for specific hardware in system 300 has relatively little effect on system's 300 cooling performance.

Figure 4:
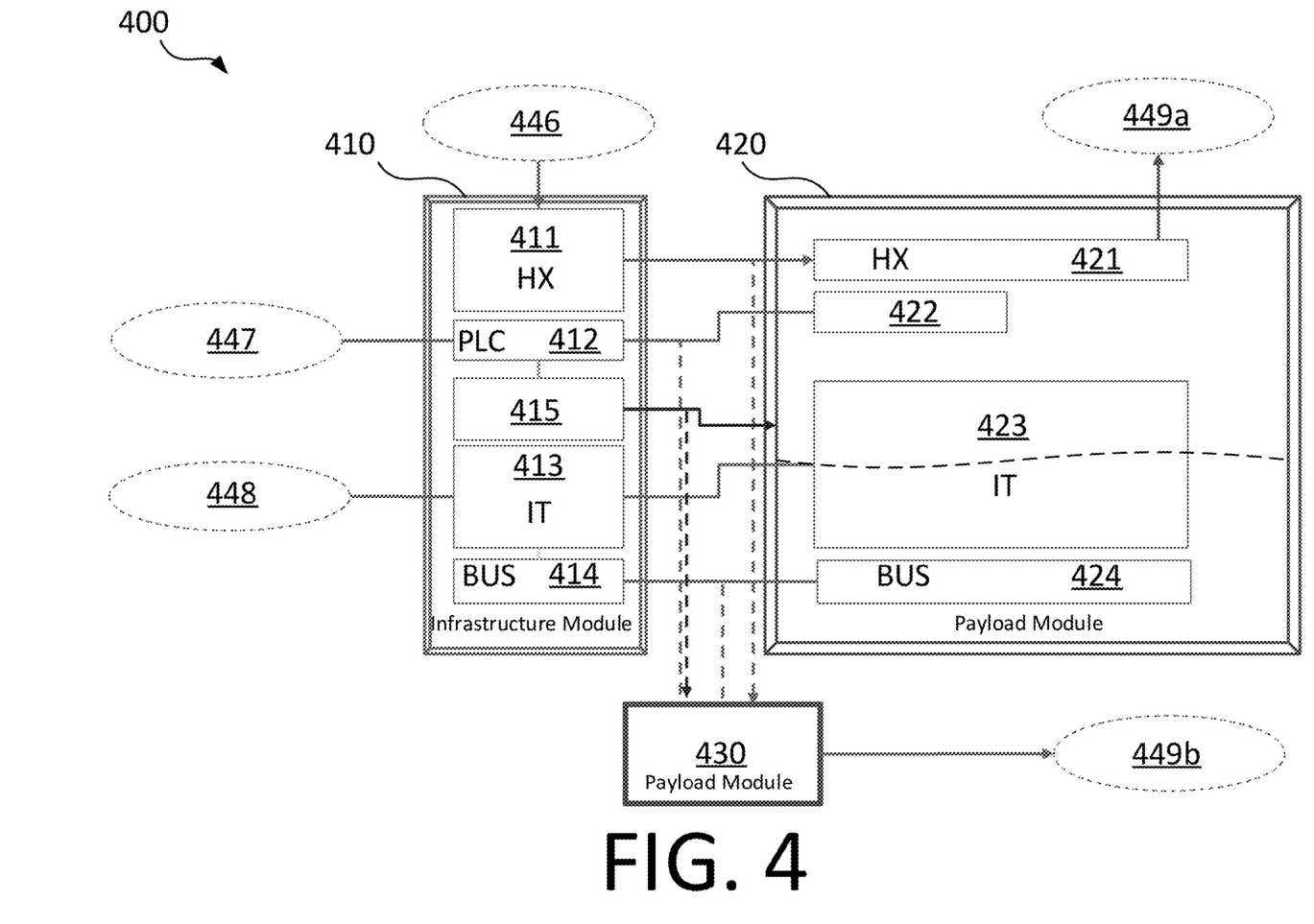
FIG. 4 is a schematic illustration of a modular cooling system according to a fourth arrangement.

FIG. 4 illustrates a system 400 in which elements are generally alike to like numbered elements of system 300. For example, infrastructure module 410 is the same as infrastructure module 310, first payload module 420 is the same as first payload module 320, second payload module 430 is the same as second payload module 330, and so on, except for specifically illustrated or described differences. For this reason, certain numerals in FIG. 4 may not be specifically mentioned herein. Moreover, all above described possible variations upon elements of systems 100, 200, and 300 are equally possible for elements of system 400 except to the extent they conflict with features of system 400 that differ from the features of systems 100, 200, or 300.

In system 400, coolant is supplied to each payload module 420, 430 in parallel through infrastructure module 410 in the same manner that system 300 distributes coolant to payload modules 320, 330 in parallel through infrastructure module 310. Thus, coolant from a coolant supply 446 flows through heat exchanger 411 before splitting into separate flow paths, one of which extends through condenser system 421 of first payload module 420 before exiting system 400 through a first coolant return 449*a* while another flow path extends through a condenser system of second payload module 430 before exiting system 400 through a second coolant return 449*b*.

System 400 has all the capabilities that system 300 shares with systems 100 and 200, as well as most of the capabilities that differentiate system 300 from systems 100 and 200. However, system 400 differs from system 300 by the location of a central fluid management system 415 within infrastructure module 410. Central fluid management system 415 governs liquid levels in the tank of the immersion cooling system in each payload module 420, 430 such that the individual payload modules 420, 430 do not need to include a dedicated circuit or controller for governing their own liquid levels. Central fluid management system 415 is in electronic communication with PLC 412, and may be governed by PLC 412 in a similar manner to the governance of distributed fluid management systems in systems 100, 200, 300. Placement of central fluid management system 415 within infrastructure module 410 provides the same ease of access to central fluid management system 415 as provided for PLC 412 without occupying space in the payload modules 420, 430.

The presence of only first payload module 420 and second payload module 430 in the illustrated example is one configuration of system 400, but in other examples, system 400 may omit second payload module 430, and in yet other examples, system 400 may include any number of payload modules having immersion cooling systems governed by central fluid management system 415.

Figure 5:
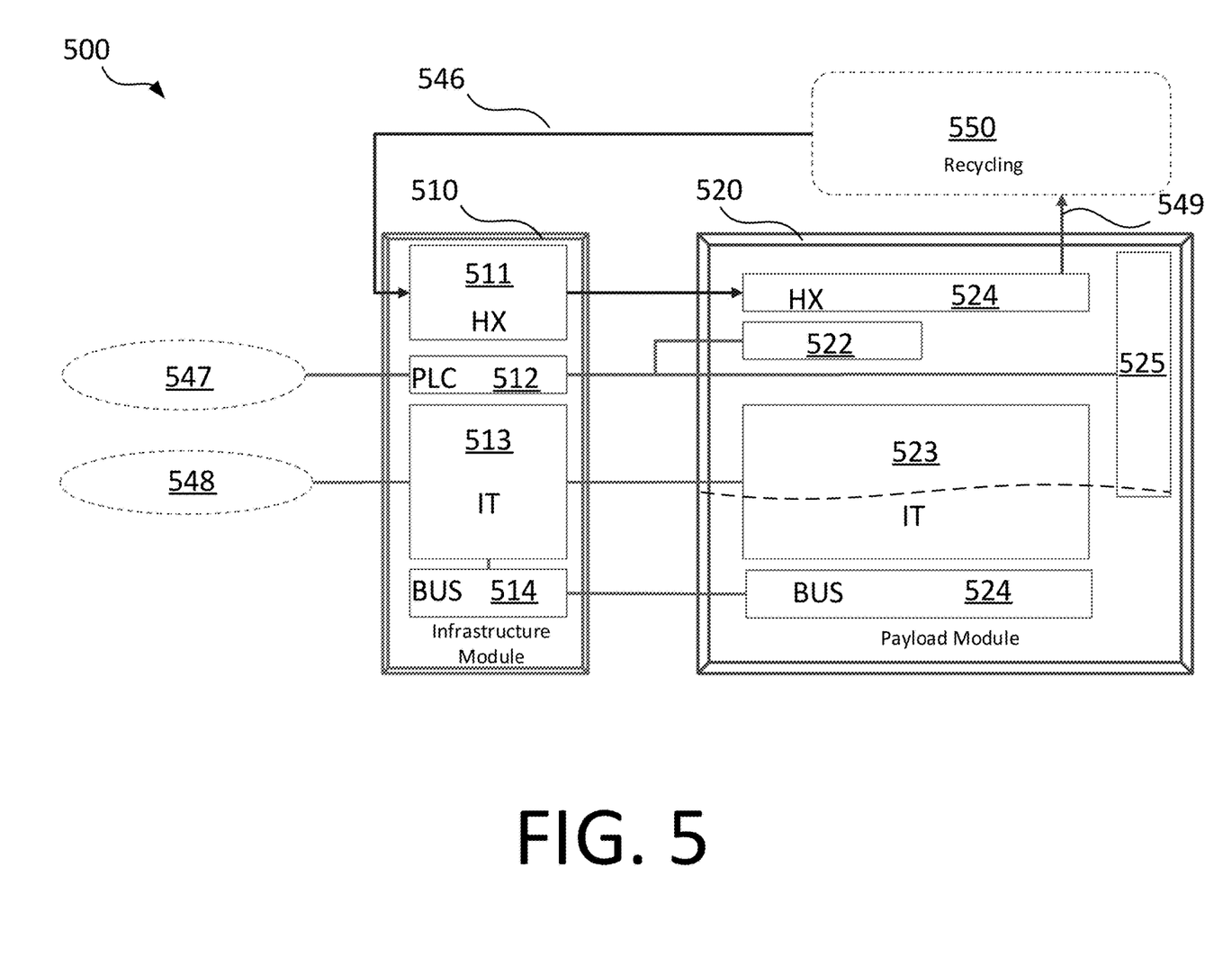
FIG. 5 is a schematic illustration of a modular cooling system according to a fifth arrangement.

FIG. 5 illustrates a system 500 in which elements are generally alike to like numbered elements of systems 100, 200, and 300. For example, infrastructure module 510 is the same as infrastructure modules 110, 210, and 310 and payload module 520 is the same as payload modules 120, 220, and 320, and so on, except for specifically illustrated or described differences. For this reason, certain numerals in FIG. 5 may not be specifically mentioned herein. Moreover, all above described possible variations upon elements of systems 100, 200, 300, and 400 are equally possible for elements of system 500 except to the extent they conflict with features of system 500 that differ from the features of systems 100, 200, 300, and 400.

System 500 includes a standalone cooler 550 that supplies coolant in series to infrastructure module 510, then to payload module 520 in series. The coolant that leaves payload module 520 at coolant return 549 returns to standalone cooler 550 to be restored to a supply temperature and re-supplied through coolant supply 546 to infrastructure module 510. Standalone cooler 550 is therefore connected in-line along a flow path of the coolant distribution system that extends through system 500 at a location downstream of condenser 524 and payload module 520 but upstream of heat exchanger 511 and infrastructure module 510.

Rather than a building or municipal supply of fluid that may be used as a coolant, standalone cooler 550 is a self-contained cooling system for the coolant used by system 500. Standalone cooler 550 may be, for example, a low-energy or passive cooler, such as a dry cooling tower or another type of dry cooler, meaning a cooler that can does not require a separate cooling liquid to extract heat from the coolant used for system 500, such as heat exchangers that dissipate heat from the coolant to ambient air. Such passive or low-energy types of standalone cooler 550 are particularly useful for implementing system 500 in remote locations where power and other utilities are limited. infrastructure module 310.

The foregoing modular systems 100, 200, 300, 400, 500 each present distinct variations on shared concepts, but modular systems according to other examples may combine those distinct variations in any way. For example, standalone cooler 550 could be used to deliver and cool coolant for systems having any number of payload modules and any flow path among the modules, including any of the flow paths of modular systems 100, 200, 300, 400. Central fluid management system 415 may replace the separate fluid management systems of any of modular systems 100, 200, 300, 500, or any variations on those modular systems. A modular system according to other examples may include any combination of payload modules connected in series with one another as shown in modular system 100, payload modules receiving coolant that has not passed through the infrastructure module as shown in modular system 200, and payload modules receiving coolant that has passed through the infrastructure module in parallel with other payload modules as shown in modular systems 300 and 400.

Figure 6:
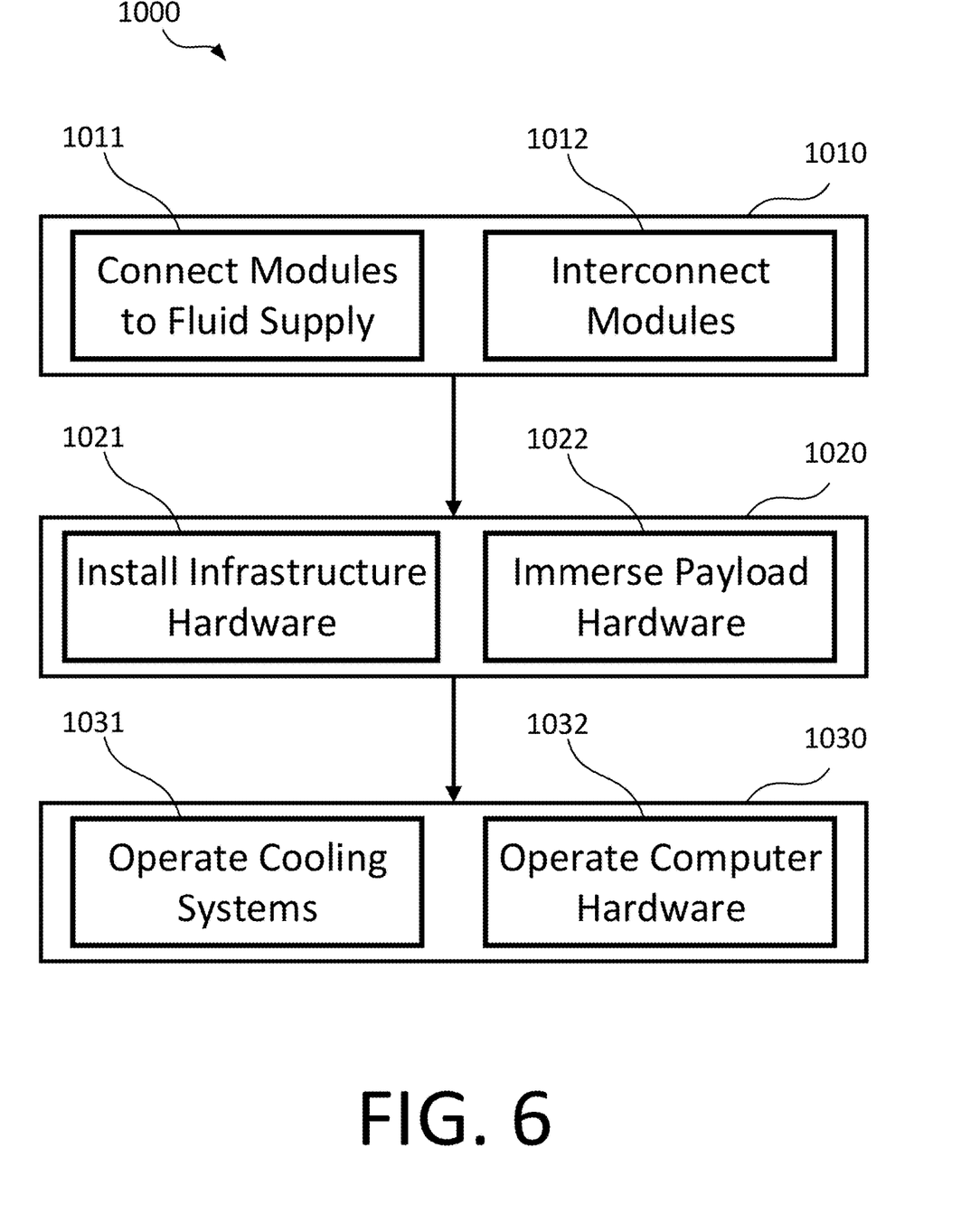
FIG. 6 is a flowchart of a method of housing and cooling electronic equipment with any of the modular cooling systems illustrated in FIGS. 1-5.

As shown in FIG. 6, a process 1000 of housing and cooling electronic equipment with any of the systems 100, 200, 300, 400, 500 described above includes a setup phase 1010, a storage phase 1020, and an operation phase 1030.

The process 1000 is described below with reference to elements of system 100 by way of example, but each reference below to any element of system 100 is equally applicable to the corresponding elements of any of systems 200, 300, 400, 500 or any possible variations on systems 100, 200, 300, 400, 500.

Setup phase 1010 includes coolant connection 1011 and module interconnection 1012, either of which may be performed before, during, or after the other. During coolant connection 1011, modules 110, 120, 130 are connected to an available distribution system for fluid coolant. Modules 110, 120, 130 may be connected in parallel or series and in any order. During module interconnection 1012, modules are connected to each other electrically, electronically, or both. For example, interconnection 1012 may include establishing electrical connection between bus bars 114, 124, connecting PLC 112 to humidity control system 122 and fluid management system 125, and extending electronic connectors such as wires or cables between modules 110, 120, 130 through which computer hardware 113, 123 can communicate electronically with computer hardware 113, 123 in any other module. Establishment of fluid connections among modules 110, 120, 130 may be considered part of either or both of coolant connection 1011 and module interconnection 1012.

Setup phase 1011 is followed by storage phase 1020, which includes infrastructure installation 1021 and immersion 1022. Either of infrastructure installation 1021 and immersion 1022 may be performed before, during, or after the other. Infrastructure installation 1021 includes placement of infrastructure hardware 113 into infrastructure module 110 so that infrastructure hardware 113 may operate on power from bus bar 114. Immersion 1022 includes immersing payload hardware 123 into the evaporable liquid in the immersion cooling systems of payload modules 120, 130. At the end of storage phase 1020, infrastructure hardware 113 and payload hardware 123 are housed and stored within their respective modules 110, 120, 130 and are prepared to operate and be cooled appropriately.

Operation phase 1030 follows storage 1020 and includes cooling 1031 and computing 1032 which may be performed concurrently. Cooling 1031 includes running heat exchanger 1011 to cool infrastructure hardware 113 and running the immersion cooling system of one of, some of, or all payload modules 120, 130 to cool payload hardware 123. Cooling 1031 may also include circulating coolant among modules 110, 120, 130. Computing step 1032 includes operating infrastructure hardware 113 and payload hardware 123. Computing 1032 may also include operation of any other computing components in any module 110, 120, 130. Operating PLC 112 to govern the immersion cooling systems, such as by controlling humidity control system 122 and fluid management system 125, may therefore be considered part of cooling 1031, computing 1032, or both.

Additions to and variations on process 1000 are possible. For example, setup phase 1010 may overlap or follow installation phase 1020. Also, additional infrastructure installation 1021 and immersion 1022 may occur during or after operation phase 1030 as hardware 113, 123 is added or swapped out of system 100.

Although the concept herein has been described with reference to particular examples, it is to be understood that these examples are merely illustrative of the principles and applications of the present concept. It is therefore to be understood that numerous modifications may be made to the illustrative examples and that other arrangements may be devised without departing from the spirit and scope of the present concept as defined by the appended claims.

The invention claimed is:

1. A method of housing and cooling computer hardware, the method comprising:
    housing first computer hardware in an infrastructure module that also houses a programmable logic controller ("PLC"), the infrastructure module having a first power consumption level and comprising an infrastructure bus bar;
    immersing second computer hardware in evaporable liquid within a two phase immersion cooling system housed by a payload module, the payload module having a second power consumption level greater than the first power consumption level and being located outside of the infrastructure module and the immersion cooling system being governed by the PLC; and
    electrically connecting a payload bus bar to the infrastructure bus bar.

2. The method of claim 1, further comprising cooling the first computer hardware with a cooling arrangement included by the infrastructure module, the cooling arrangement of the infrastructure module comprising at least one of a liquid-air heat exchanger and an arrangement of metal plates connected by one or more conduits for carrying liquid.

3. The method of claim 2, further comprising connecting the cooling arrangement of the infrastructure module and a condenser of the two phase immersion cooling system in parallel to a building liquid supply.

4. The method of claim 3, further comprising connecting the cooling arrangement of the infrastructure module and the condenser in series to a building liquid supply.

5. The method of claim 4, further comprising connecting the cooling arrangement of the infrastructure module and the condenser to the building liquid supply such that liquid is supplied by the building liquid supply to the cooling arrangement of the infrastructure module and is returned to the building liquid supply from the condenser.

6. The method of claim 1, further comprising supplying electrical power to the payload module and the second computer hardware through the infrastructure module.

7. The method of claim 1, wherein the payload module is a first payload module, and comprising immersing third computer hardware in evaporable liquid in a tank housed by a second payload module that includes a two phase immersion cooling system, the two phase immersion cooling system of the second payload module being governed by the PLC.

8. The method of claim 1, the payload module has the dimensions of a single EIA-310 standard server rack or of two or three adjoining EIA-310 standard server racks.

9. The method of claim 2, wherein the cooling arrangement has a first cooling capacity.

10. The method of claim 9, wherein the two-phase immersion cooling system has a second cooling capacity higher than the first cooling capacity.

11. The method of claim 1, further comprising connecting the infrastructure bus bar to an external power supply.

12. The method of claim 1, wherein the payload module is a first payload module and the immersion cooling system of the first payload module includes a first condenser, the method further comprising:
    connecting the first condenser and a second condenser of a second payload module in series along a flow path of cooling liquid.

13. The method of claim 1, wherein the payload module is a first payload module and the immersion cooling system of the first payload module includes a first condenser, the method further comprising:

connecting the first condenser and a second condenser of a second payload module in parallel along a flow path of cooling liquid.

* * * * *